(12) United States Patent
Gurumurthy et al.

(10) Patent No.: US 9,362,910 B2
(45) Date of Patent: Jun. 7, 2016

(54) LOW CLOCK-POWER INTEGRATED CLOCK GATING CELL

(71) Applicant: Texas Instruments Incorporated, Dallas, TX (US)

(72) Inventors: Girishankar Gurumurthy, Bangalore (IN); Mahesh Ramdas Vasishta, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 7 days.

(21) Appl. No.: 14/089,238

(22) Filed: Nov. 25, 2013

(65) Prior Publication Data

US 2014/0184271 A1    Jul. 3, 2014

Related U.S. Application Data

(60) Provisional application No. 61/746,773, filed on Dec. 28, 2012.

(51) Int. Cl.
*H03K 3/289* (2006.01)
*H03K 19/00* (2006.01)

(52) U.S. Cl.
CPC .................. *H03K 19/0016* (2013.01)

(58) Field of Classification Search
None
See application file for complete search history.

(56) References Cited

U.S. PATENT DOCUMENTS

| 5,323,065 | A  | * | 6/1994  | Ebihara ................ H03K 3/037 326/104 |
| 6,057,709 | A  | * | 5/2000  | Hesley ................ G06F 12/0895 326/52 |
| 7,391,250 | B1 | * | 6/2008  | Chuang ........................ 327/211 |
| 7,518,426 | B1 | * | 4/2009  | Smith .......................... 327/199 |
| 7,596,732 | B2 | * | 9/2009  | Branch et al. ................. 714/726 |
| 7,825,689 | B1 | * | 11/2010 | Vasishta ............... H03K 3/0375 326/119 |
| 7,868,677 | B2 | * | 1/2011  | Jain ......................... H03K 3/12 327/202 |
| 7,893,722 | B2 | * | 2/2011  | Kvinta et al. ................... 326/96 |
| 8,058,905 | B1 | * | 11/2011 | Klein et al. .................... 326/93 |
| 8,667,349 | B2 | * | 3/2014  | Hsieh ............ G01R 31/318541 714/726 |
| 8,975,949 | B2 | * | 3/2015  | Berzins ................ H03K 3/356 327/291 |

* cited by examiner

*Primary Examiner* — Alexander H Taningco
*Assistant Examiner* — Nelson Correa
(74) *Attorney, Agent, or Firm* — John R. Pessetto; Frank D. Cimino

(57) ABSTRACT

In an integrated clock gating (ICG) cell a latch is coupled to a NOR gate. The NOR gate receives an enable signal. The latch is configured to generate a latch output in response to the state of the enable signal. The latch includes a tri-state inverter. A NAND gate is coupled to the latch and the NAND gate is configured to generate an inverted clock signal in response to the latch output and a clock input.

13 Claims, 3 Drawing Sheets

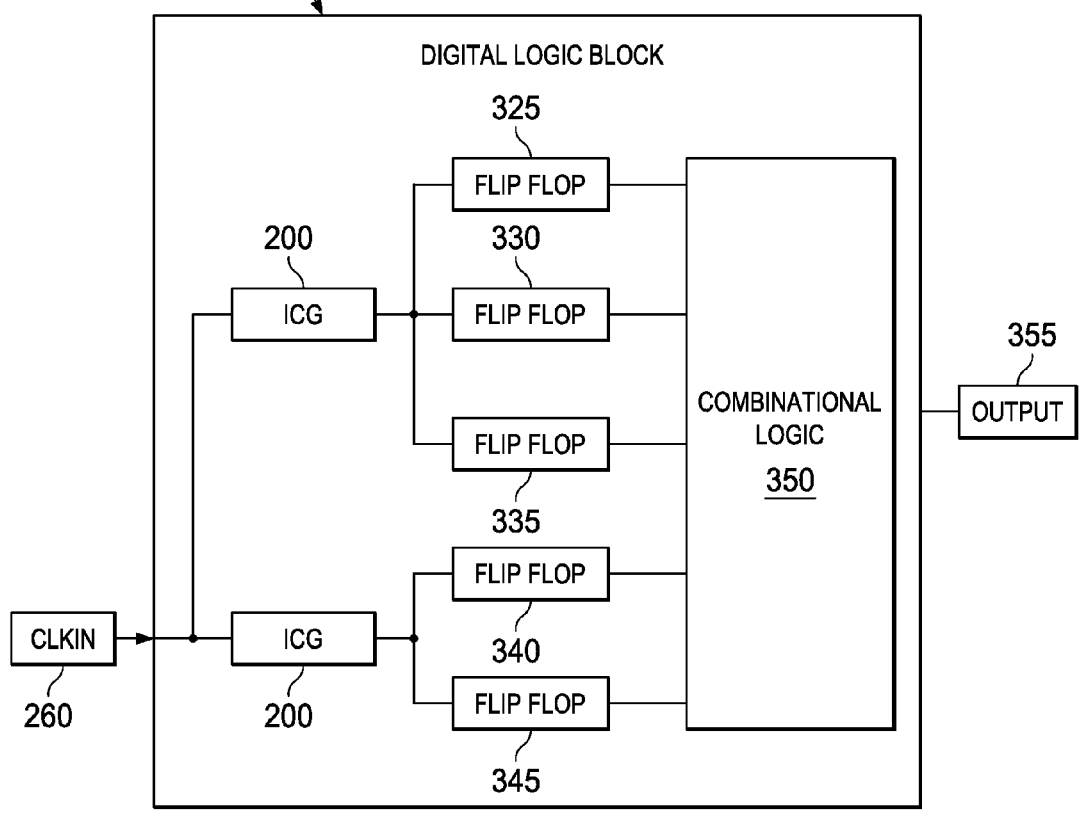

LOW CLOCK-POWER INTEGRATED CLOCK GATING CELL

This application claims the benefit of Provisional Application No. 61/746,773, filed Dec. 28, 2012.

TECHNICAL FIELD

Embodiments of the disclosure relate to integrated clock gating (ICG) cells in an integrated circuit (IC).

BACKGROUND

Integrated clock gating (ICG), in digital IC designs, is used to reduce power consumption by preventing individual flip flops from switching between logic states when not in use. In integrated clock gating, the flip flops which are not contributing to the functionality of the circuit are selectively inactivated. The ICG cells are activated or inactivated based on certain conditions. The conditions for disabling the clock cells are a design choice. In advanced digital designs, several clock gating cells are used which results in increased power consumption. A comparison of percentage of power consumption between the units in an example IC are logic implementation consuming 29%, flip flops consuming 27%, RAM consuming 18%, clock tree consuming 16% and the ICG consuming 10% of the total power. It is apparent that if the power consumption of one of the aforementioned units can be reduced, the overall power consumption of the IC can be reduced.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An example embodiment provides an integrated clock gating (ICG) cell. In the ICG, a latch is coupled to a NOR gate. The NOR gate receives an enable signal. The latch is configured to generate a latch output in response to the state of the enable signal. The latch includes a tri-state inverter. A NAND gate is coupled to the latch and the NAND gate is configured to generate an inverted clock signal in response to the latch output and a clock input.

Another example embodiment provides an integrated clock gating (ICG) cell. In the ICG, a latch is coupled to a NOR gate. The NOR gate receives an enable signal. The latch is configured to generate a latch output in response to the state of the enable signal. The latch includes a tri-state inverter. A NAND gate is coupled to the latch and the NAND gate is configured to generate an inverted clock signal in response to the latch output and a clock input. The latch includes a plurality of back-to-back connected inverters coupled to the tri-state inverter. The latch generates a latch output in response to an output of the NOR gate, the clock input and the inverted clock signal. The latch output and the clock input are received at the NAND gate, to generate the inverted clock signal.

Another example embodiment provides an apparatus. The apparatus includes a clock input, a plurality of integrated clock gating cells configured to receive the clock input, and a plurality of flip flops coupled to each of the plurality of integrated clock gating cells. Each of the plurality of integrated clock gating cells includes a latch coupled to a NOR gate. The NOR gate receives an enable signal. The latch is configured to generate a latch output in response to the state of the enable signal. The latch includes a tri-state inverter. A NAND gate is coupled to the latch and is configured to generate an inverted clock signal in response to the latch output and a clock input.

Other aspects and example embodiments are provided in the Drawings and the Detailed Description that follows.

BRIEF DESCRIPTION OF THE VIEWS OF DRAWINGS

FIG. 3 illustrates a schematic of digital logic block using integrated clock gating cell according to an embodiment;

FIG. 4 illustrates a truth table of the logic operation of the ICG according to an embodiment.

DETAILED DESCRIPTION OF THE EMBODIMENTS

Figure 1:
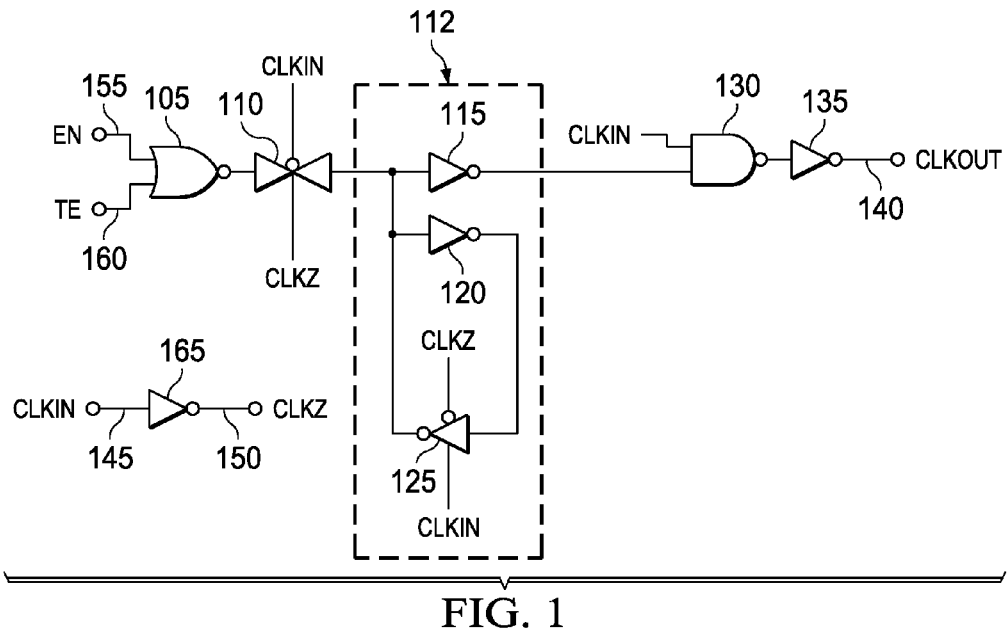
FIG. 1 illustrates a schematic of an integrated clock gating cell (ICG)

FIG. 1 illustrates a schematic of an ICG. The ICG includes a NOR gate 105 that receives a test enable signal 160 and an enable signal 155. The NOR gate 105 is coupled to a transmission gate 110. The transmission gate 110 receives a clock input CLKIN 145 and an inverted clock signal CLKZ 150. The inverted clock signal 150 is generated through an inverter 165 that receives the CLKIN 145 and outputs the inverted clock signal CLKZ 150. The output of the transmission gate is coupled to a latch 112 that includes an inverter 115 and back-to-back inverters 120 and 125. The inverter 125 is a tri-state inverter. Output of the latch 112 is coupled to a NAND gate 130. The clock input CLKIN 145 is also given as another input to the NAND gate 130. An output of the NAND gate 130 is coupled to an inverter 135 which generates the clock output CLKOUT on a line 140.

The operation of the ICG of FIG. 1 is explained now. Consider an example when the enable signal 155 is at logic 1 and the test enable signal 160 is at logic 0. The output at the NOR gate 105 will be at logic 0. The transmission gate 110 receives the logic 0 from the output of the NOR gate 105 and the clock input 145 and inverted clock signal 150 and passes the logic 0, when CLKIN 145 is at logic 0. The back-to-back connected inverters 120 and 125 in effect pass logic 0 to the inverter 115. Thus, logic 1 will be seen at one of the inputs to the NAND gate 130 from the output of the inverter 115. If the clock input 145 is at logic 0, the NAND gate 130 receives logic 1 from the inverter 115 and generates logic 1. The inverter 135 generates logic 0 at the clock output on the line 140. The inverted clock signal 150 to the circuit is generated using inverter 165. This inverted clock signal 150 is given as input to the transmission gate 110 and tri-state inverter 125. All the logic blocks described above are implemented using transistors. It will be apparent that power consumption of the ICG can be reduced if the number of transistors is reduced in some way provided the functionality of the ICG is the same.

It is noted that the power consumption, when the integrated clock gating cell is gated, is seen mainly at the transistors that receive a constantly toggling input, i.e. at the transmission gate 110, the tri-state inverter 125 and at the inverter 165. At the transmission gate 110, two clock gate capacitances are present due to the constant toggling of both clock input 145 and inverted clock signal 150. Similarly, two clock gate capacitances are present at the tri-state inverter 125. At NAND gate 130, two clock gate capacitances are present, as two transistors receive the toggling clock input when the NAND gate 130 is used to implement the NAND logic. At the inverter 165 two clock gate capacitances are seen due to the constant toggling of both clock input 145 and inverted clock signal 150. Therefore, a total of 8 clock gate capacitances are responsible for the power consumed by the transistors. Further, inverter short-circuit power is seen at inverter 165 when inverted clock signal 150 is generated. It is apparent that if the power consumption of one of the aforementioned units can be reduced, the overall power consumption of the ICG can be reduced.

Figure 2:
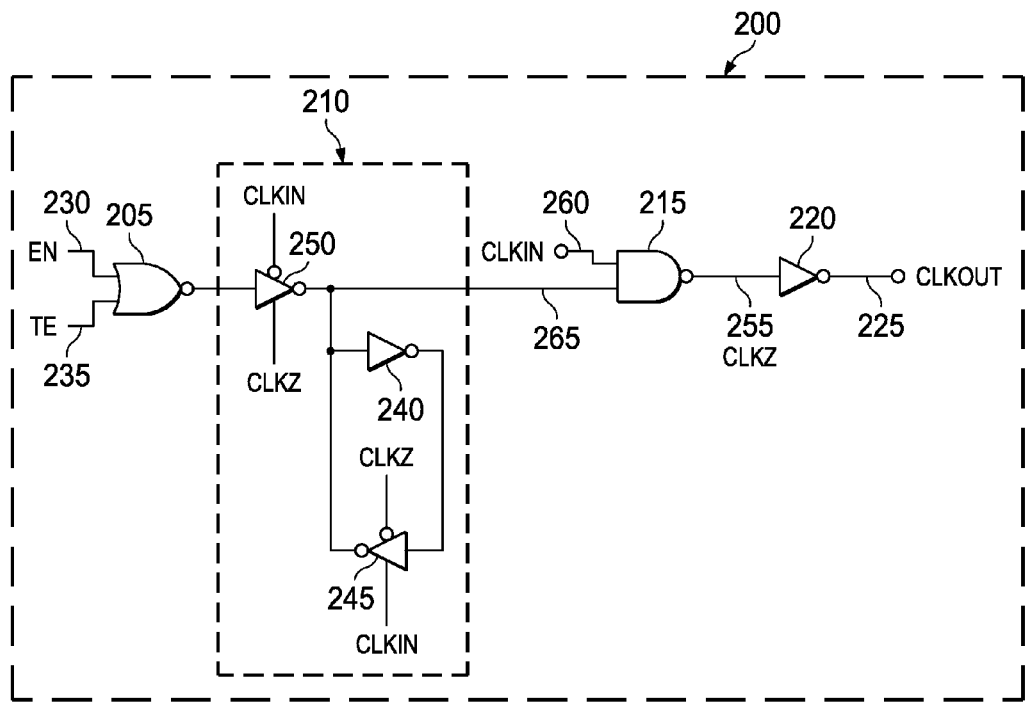
FIG. 2 illustrates a schematic of an ICG according to an embodiment.

FIG. 2 illustrates an integrated clock gating cell ICG 200 according to an embodiment where the numbers of transistors are reduced compared to the ICG in FIG. 1 and still achieves the same functionality. The ICG 200 includes a latch 210 that is coupled to a NOR gate 205. The NOR gate 205 receives an enable signal EN 230. The NOR gate 205 receives a test enable signal TE 235 in addition to the enable signal 230. The latch 210 is configured to generate a latch output (on a line 265) in response to the state of the enable signal EN 230. A NAND gate 215 is coupled to the latch 210; the NAND gate 215 is configured to generate an inverted clock signal CLKZ 255 in response to the latch output 265 and a clock input CLKIN 260. The latch 210 receives an output of the NOR gate 205, the clock input 260 and the inverted clock signal CLKZ 255 and generates the latch output 265. The latch 210 includes a tri-state inverter 250 and two back-to-back connected inverters. The two back-to-back connected inverters include an inverter 240 and a tri-state inverter 245. The NAND gate 215 receives the latch output 265 and the clock input CLKIN 260 and outputs the inverted clock signal CLKZ 255. An inverter 220 is coupled to the NAND gate 215 that outputs the clock output 225 in response to the inverted clock signal 255. It is noted that all the logic blocks of the ICG 200 are implemented using transistors.

Operation of the ICG 200 in accordance with the embodiment is explained now. Consider the situations where EN 230 or TE 235 is at logic 1 or both EN 230 and TE 235 are at logic 1. When clock input 260 is at logic 0, the latch 210 stores logic 1 using the tri-state inverter 250 and the two back-to-back connected inverters. The back-to-back connected inverters include the inverter 240 and the tri-state inverter 245. Thus, logic 1 is seen at the latch output 265, which is an input to the NAND gate 215. If the clock input 260 is at logic 0, then the output 255 of the NAND gate is at logic 1. Therefore, the inverted clock signal 255 is generated at the output of the NAND gate. The inverter 220 generates logic 1 when inverted clock signal at 255 is at logic 0 and vice versa.

The ICG cells in FIGS. 1 and 2 are implemented using PMOS and NMOS transistors; therefore the inverter 165 in FIG. 1 is implemented using one PMOS and one NMOS transistor. The inverter 165 includes the PMOS transistor, whose drain is connected to the drain of the NMOS transistor. The gates of the PMOS and the NMOS transistors are connected to the clock input 145. The source of the PMOS transistor is connected to the power supply voltage $V_{DD}$ and the source of the NMOS is connected to the ground voltage Vss. Hence, by removing the inverter 165, the need of having 2 transistors can be eliminated. It can be seen that the signal CLKZ 255 is generated without using the inverter (as opposed to the ICG in FIG. 1) and thereby eliminating 2 transistors used to implement the inverter.

Through the integrated clock gating cell 200 in FIG. 2 the number of clock gate capacitances is reduced from 8 in FIG. 1, to 4 clock gate capacitances. This is achieved by using the output of NAND gate 215 as the inverted clock signal 255, thus eliminating the need for inverting the clock input 260 and hence saving 2 clock gate capacitances (by removing the need for two transistors needed for the inverter 165 of FIG. 1). Further, by using the output of NAND gate 215 as inverted clock signal 255, when the integrated clock gating cell is in gated mode, the inverted clock signal 255 does not toggle at the tri-state inverter 250 and tri-state inverter 245. Thus 2 more clock gate capacitances are eliminated. Therefore, the power gate capacitances are reduced from 8 to 4 as compared with the ICG of FIG. 1. In addition to the power saved by reducing 4 clock gate capacitances, the inverter short-circuit power dissipation is also eliminated.

In one embodiment, through the implementation of the above discussed integrated clock gating cell 200, the clock toggling power is significantly reduced by 25% as compared to an ICG of FIG. 1. In addition to this reduction in power, the area used to implement the ICG is also reduced. The ICG 200 implementation does not compromise on the robustness aspect and moreover does not employ dynamic logic circuitry, thereby avoiding new failure mechanisms.

FIG. 3 illustrates a schematic of a digital logic block 320 using integrated clock gating cells according to an embodiment. The digital logic block 320 includes a plurality of integrated clock gating cells 200, a plurality of flip flops (325, 330, 335, 340 and 345) coupled to each of the plurality of the integrated clock gating cells 200. The ICGs 200 are analogous to the ICG explained in FIG. 2 both in connections and operation. The digital logic block 320 also includes a combinational logic 350 connected to the flip flops (325-345) and is used in conjunction with synchronous modules or a plurality of synchronous modules in an IC. These synchronous modules typically include multiplexers, communication ports, processors, storage elements etc. The digital logic block 320 receives a clock input 260 and an output is generated at 355;

Each of the integrated clock gating cells 200 includes a latch 210 that is coupled to a NOR gate 205. The NOR gate 205 receives an enable signal 230 and a test enable signal 235. The latch 210 is configured to generate a latch output 265 in response to the state of the enable signal 230. A NAND gate 215 is coupled to the latch 210 and is configured to generate an inverted clock signal 255 in response to the latch output 265 and a clock input 260. The latch 210 comprises a plurality of back-to-back connected inverters coupled to the tri-state inverter 250. The latch 210 receives an output of the NOR gate 205, the clock input 260 and the inverted clock signal 255 and generates the latch output 265 which is received at the NAND gate 215. The NAND gate 215 receives the clock input 260 in addition to the latch output 265 to generate the inverted clock signal 255, without using a separate inverter.

In the ICGs 200, the inverted clock signal 255 is generated at the output of the NAND gate 215 which is received by a tri-state inverter 250 at the NOR gate 205 output and the tri-state inverter 245 of the latch. The number of clock gate capacitances is reduced from 8 in FIG. 1, to 4 clock gate capacitances. This is achieved by using the output of NAND gate 215 as the inverted clock signal 255, thus eliminating the need for inverting the clock input 260 and hence saving 2 clock gate capacitances. Further, by using the output of NAND gate 215 as inverted clock signal 255, when the integrated clock gating cell 200 is in gated mode, no toggling of the inverted clock signal 215 takes place at the tri-state inverter 250 and the tri-state inverter 245. Thus 2 more clock gate capacitances are reduced. Hence, the power consuming gate capacitances are reduced from 8 to 4 as compared to the ICG of FIG. 1. In addition, the inverter short-circuit power dissipation is also eliminated. Therefore, the power saved in the entire digital logic block 320 is significant since at each ICG cell, 4 clock gate capacitances and inverter short circuit power dissipation are eliminated.

FIG. 4 illustrates a truth table of the logic operation of the ICG of FIG. 2. The clock input 260 in column 1, 415 and the latch output 265 in column 2, 430 are the inputs received at the NAND gate 215. CLKZ 150 in column 3, 450 is the inverted clock signal that is generated using the inverter 165. CLKZ 255 in column 4, 435 is the inverted clock signal generated at the output of the NAND gate 215 in accordance with the embodiment. Column 5, 440 is the clock output 140 which is the clock output of the ICG in FIG. 1. Column 6, 425 is the clock output 225 generated at the output of the ICG 200, in accordance with the embodiment.

Comparing CLKZ 150 and CLKZ 255, it can be seen that the state of the inverted clock signal is the same except at 455. The state of the ICG 200 at 455 is gated as the latch output 265 is at logic 0 and hence the difference between CLKZ 150 and CLKZ 255. It does not adversely affect the functionality of the ICG 200. Now comparing the CLKOUT 225 and the CLKOUT 140, it can be seen that the CLKOUT 225 and the CLKOUT 140 are the same for all the conditions. Therefore, there is no change in the clock output 225 when the output of the NAND gate 215 is used as the inverted clock signal 255. The benefit of such an implementation is that, power is saved by eliminating 4 clock gate capacitances and by eliminating the inverter short circuit power dissipation.

Figure 5:
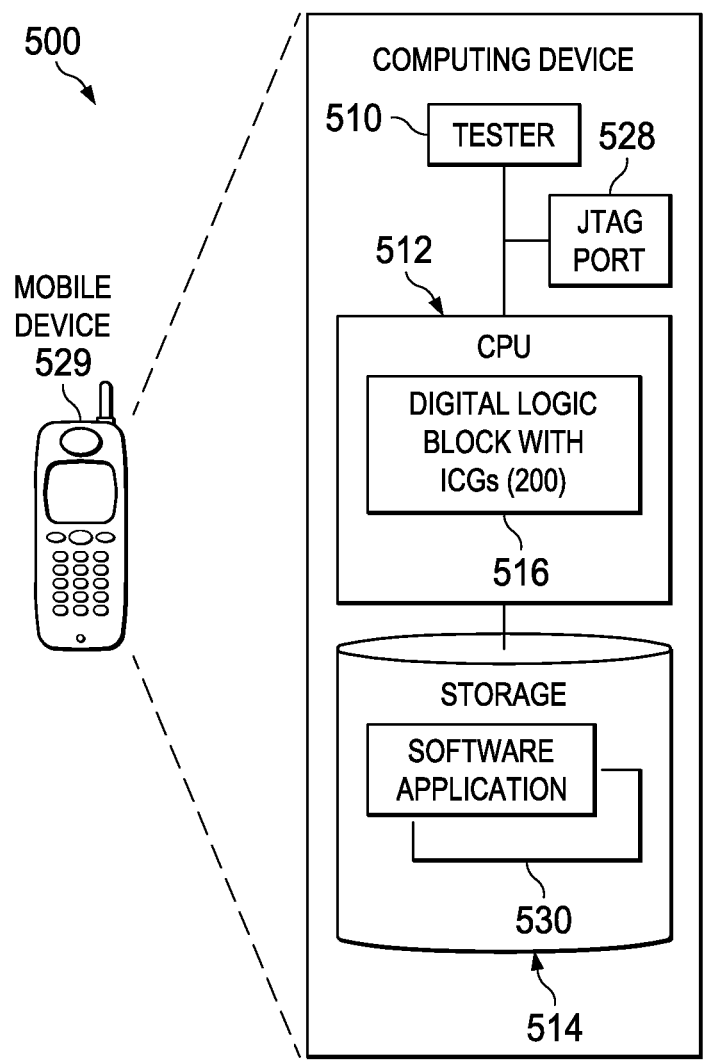
FIG. 5 illustrates a computing device using the ICG according to an embodiment.

FIG. 5 illustrates a computing device according to an embodiment. The computing device 500 is, or is incorporated into, a mobile communication device 529, such as a mobile phone, a personal digital assistant, a personal computer, or any other type of electronic system.

In some embodiments, the computing device 500 comprises a megacell or a system-on-chip (SoC) which includes control logic such as a CPU 512 (Central Processing Unit), a storage 514 (e.g., random access memory (RAM)) and a tester 510. The CPU 512 can be, for example, a CISC-type (Complex Instruction Set Computer) CPU, RISC-type CPU (Reduced Instruction Set Computer), or a digital signal processor (DSP). The storage 514 (which can be memory such as RAM, flash memory, or disk storage) stores one or more software applications 530 (e.g., embedded applications) that, when executed by the CPU 512, perform any suitable function associated with the computing device 500. The tester 510 comprises logic that supports testing and debugging of the computing device 500 executing the software application 530. For example, the tester 510 can be used to emulate a defective or unavailable component(s) of the computing device 500 to allow verification of how the component(s), were it actually present on the computing device 500, would perform in various situations (e.g., how the component(s) would interact with the software application 530). In this way, the software application 530 can be debugged in an environment which resembles post-production operation.

The CPU 512 typically comprises memory and logic which store information frequently accessed from the storage 514. Various subsystems (such as the CPU 512 and the storage 514) of the computing device 500 include digital logic block 516 which are used during the execution of the software application 530. The digital logic block 516 is analogous to the digital logic block 320 in connections and operation. Because of the relatively large numbers of instantiated flip-flop latches, the ICG cells 200 used increases; hence a reduction in the power consumption of the integrated clock gating cell can lead to significant power savings.

In the ICGs 200 the number of clock gate capacitances is reduced from 8 seen in FIG. 1, to 4 clock gate capacitances according to the embodiment. This is achieved by using the output of NAND gate 215 as the inverted clock signal 255, thus eliminating the need for inverting the clock input and hence saving 2 clock gate capacitances. Further, by using the output of NAND gate 215 as inverted clock signal 255, when the integrated clock gating cell 200 is in gated mode, no toggling of the inverted clock signal 255 takes place at the tri-state inverter 250 and tri-state inverter 245, thus 2 more clock gate capacitances are reduced. Hence the power consuming gate capacitances are reduced from 8 to 4. In addition to the power saved by reducing 4 clock gate capacitances, the inverter short-circuit power dissipation is also eliminated. Therefore the power saved in the computing device 500 is significant as at each ICG cell 200, 4 clock gate capacitances and inverter short circuit power dissipation are eliminated.

In the foregoing discussion, the terms "coupled" or "connected" means at least either a direct electrical connection between the devices connected or an indirect connection through one or more passive intermediary devices. The term "circuit" means at least either a single component or a multiplicity of passive components, that are connected together to provide a desired function. The term "signal" means at least one current, voltage, charge, data, or other signal.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. An integrated clock gating cell comprising:
    a NOR gate receiving an enable signal;
    a latch coupled to an output of the NOR gate, the latch configured to generate a latch output in response to a state of the enable signal, the latch comprising a tri-state inverter; and
    a NAND gate coupled to an output of the latch, the NAND gate configured to generate an inverted clock signal in response to the latch output and a clock input received directly to the NAND gate, the inverted clock signal being generated without using an inverter.

2. The integrated clock gating cell of claim 1, wherein the latch comprises a plurality of back-to-back connected inverters coupled to the tri-state inverter.

3. The integrated clock gating cell of claim 1, wherein the latch generates the latch output in response to receiving the output of the NOR gate, the clock input and the inverted clock signal.

4. The integrated clock gating cell of claim 1, wherein the NOR gate receives a test enable signal in addition to the enable signal.

5. The integrated clock gating cell of claim 1 further comprising:
    an inverter coupled to the NAND gate, wherein a clock output is generated at an output of the inverter in response to the inverted clock signal generated from the NAND gate.

6. An integrated clock gating cell comprising:
    a NOR gate receiving an enable signal;
    a latch coupled to an output of the NOR gate, the latch configured to generate a latch output in response to a state of the enable signal, the latch comprising a tri-state inverter; and
    a NAND gate coupled to the latch, the NAND gate configured to generate an inverted clock signal in response to the latch output and a clock input received directly to the NAND gate, the inverted clock signal being generated without using an inverter; wherein the latch comprises a plurality of back-to-back connected inverters coupled to the tri-state inverter, and wherein the latch receives the output of the NOR gate, the clock input and the inverted clock signal and generates the latch output.

7. The integrated clock gating cell of claim 6 further comprising:
an inverter coupled to the NAND gate, wherein a clock output is generated at an output of the inverter in response to the inverted clock signal generated from the NAND gate.

8. An apparatus comprising:
a clock input; and
a plurality of integrated clock gating cells configured to receive the clock input; and
a plurality of flip flops coupled to each of the plurality of integrated clock gating cells, wherein each of the plurality of integrated clock gating cells comprises:
a NOR gate receiving an enable signal;
a latch coupled to an output of the NOR gate, the latch configured to generate a latch output in response to a state of the enable signal, the latch comprising a tri-state inverter; and
a NAND gate coupled to the latch, the NAND gate configured to generate an inverted clock signal in response to the latch output and the clock input received directly to the NAND gate, the inverted clock signal being generated without using an inverter.

9. The apparatus of claim 8 further comprising a combinational logic coupled to the plurality of flip flops for generating an output.

10. The apparatus of claim 8, wherein the latch comprises a plurality of back-to-back connected inverters coupled to the tri-state inverter.

11. The apparatus of claim 8, wherein the latch generates the latch output in response to receiving the output of the NOR gate, the clock input and the inverted clock signal.

12. The apparatus of claim 8, wherein the NOR gate receives a test enable signal in addition to the enable signal.

13. The apparatus of claim 8 further comprising:
an inverter coupled to the NAND gate, wherein a clock output is generated at an output of the inverter in response to the inverted clock signal generated from the NAND gate.

* * * * *